(12) United States Patent
Gerber

(10) Patent No.: US 9,257,341 B2
(45) Date of Patent: *Feb. 9, 2016

(54) METHOD AND STRUCTURE OF PACKAGING SEMICONDUCTOR DEVICES

(71) Applicant: Texas Instruments Incorporated, Dallas, TX (US)

(72) Inventor: Mark A. Gerber, Lucas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/321,500

(22) Filed: Jul. 1, 2014

(65) Prior Publication Data
US 2015/0008583 A1 Jan. 8, 2015

Related U.S. Application Data

(60) Provisional application No. 61/842,182, filed on Jul. 2, 2013.

(51) Int. Cl.
| | |
|---|---|
| *H01L 21/78* | (2006.01) |
| *H01L 21/56* | (2006.01) |
| *H01L 23/00* | (2006.01) |
| *H01L 23/16* | (2006.01) |
| *H01L 23/31* | (2006.01) |

(52) U.S. Cl.
CPC .............. *H01L 21/78* (2013.01); *H01L 21/561* (2013.01); *H01L 23/16* (2013.01); *H01L 24/18* (2013.01); *H01L 21/568* (2013.01); *H01L 23/3107* (2013.01)

(58) Field of Classification Search
CPC ...... H01L 21/78; H01L 21/561; H01L 21/568
See application file for complete search history.

(56) References Cited

U.S. PATENT DOCUMENTS

| | | | | |
|---|---|---|---|---|
| 2013/0052777 | A1* | 2/2013 | Xu et al. | 438/127 |
| 2013/0334682 | A1* | 12/2013 | Kim | 257/737 |
| 2014/0021583 | A1* | 1/2014 | Lo et al. | 257/532 |

* cited by examiner

*Primary Examiner* — Selim Ahmed
*Assistant Examiner* — Wasiul Haider
(74) *Attorney, Agent, or Firm* — Steven A. Shaw; Frank D. Cimino

(57) ABSTRACT

A method for fabricating packaged semiconductor devices; attaching a batch-sized metallic grid with openings onto an adhesive tape having an insulating clear core covered by a layer of UV-releasable adhesive, the openings sized larger than a semiconductor chip; attaching a semiconductor chip onto the tape of each window, the chip terminals facing the adhesive surface; laminating insulating material of low coefficient of thermal expansion to fill gaps between each chip and respective grid; turning over assembly to place a carrier under backside of chips and lamination and to remove the tape; plasma-cleaning the assembly front side and sputtering uniform at least one metal layer across the assembly; optionally plating metal layers; and patterning the metal layers to form rerouting traces and extended contact pads for assembly.

6 Claims, 4 Drawing Sheets

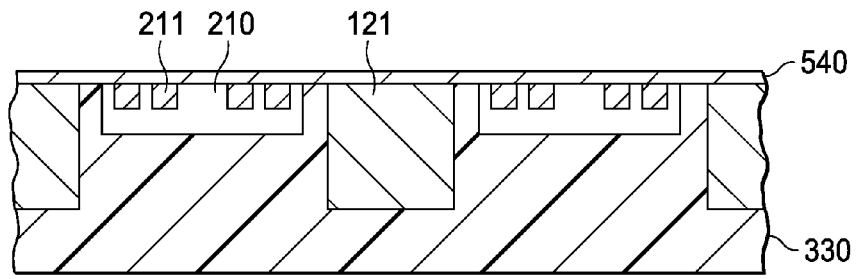
FIG. 5
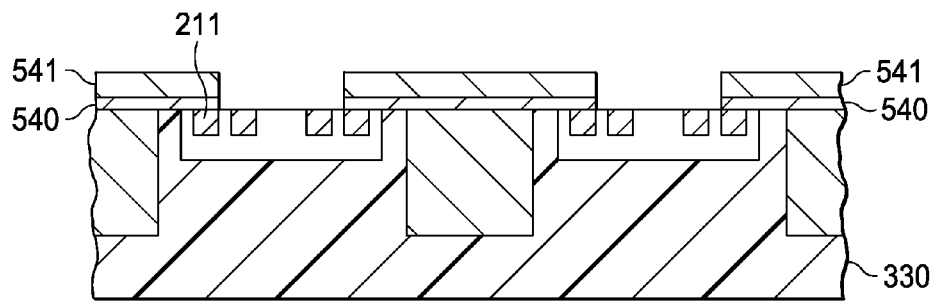
FIG. 6
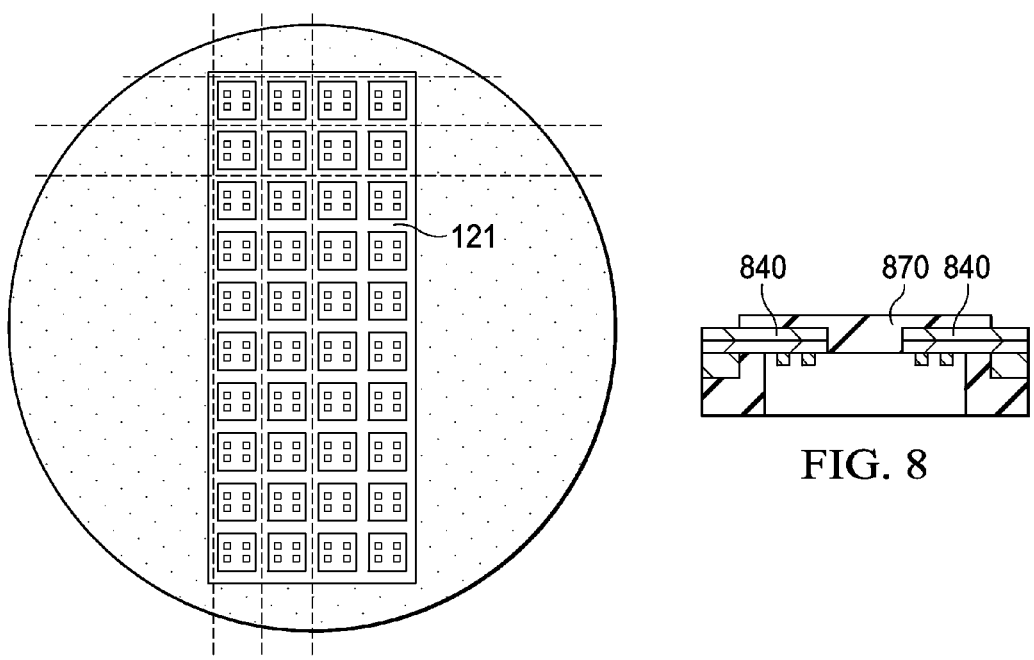
FIG. 7
FIG. 8

METHOD AND STRUCTURE OF PACKAGING SEMICONDUCTOR DEVICES

FIELD

Embodiments of the invention are related in general to the field of semiconductor devices and processes, and more specifically to the structure and fabrication method of packaging embedded semiconductor devices.

DESCRIPTION OF RELATED ART

It is common practice to manufacture the active and passive components of semiconductor devices into round wafers sliced from elongated cylinder-shaped single crystals of semiconductor elements or compounds. The diameter of these solid state wafers may reach up to 12 inches. Individual devices are then typically singulated from the round wafers by sawing streets in x- and y-directions through the wafer in order to create rectangularly shaped discrete pieces from the wafers; commonly, these pieces are referred to as die or chips. Each chip includes at least one device coupled with respective metallic contact pads. Semiconductor devices include many large families of electronic components; examples are active devices such as diodes and transistors like field-effect transistors, passive devices such as resistors and capacitors, and integrated circuits with sometimes far more than a million active and passive components.

After singulation, one or more chips are attached to a discrete supporting substrate such as a metal leadframe or a rigid multi-level substrate laminated from a plurality of metallic and insulating layers. The conductive traces of the leadframes and substrates are then connected to the chip contact pads, typically using bonding wires or metal bumps such as solder balls. For reasons of protection against environmental and handling hazards, the assembled chips may be encapsulated in discrete robust packages, which frequently employ hardened polymeric compounds and are formed by techniques such as transfer molding. The assembly and packaging processes are usually performed either on an individual basis or in small groupings such as a strip of leadframe or a loading of a mold press.

In order to increase productivity by a quantum jump and reduce fabrication cost, technical efforts have recently been initiated to re-think certain assembly and packaging processes with the goal to increase the volume handled by each batch process step. As an example, adaptive patterning methods have been described for fabricating batch-process based package structures. Other technical efforts are directed to keep emerging problems such as adhesion and warpage under control.

SUMMARY OF THE INVENTION

Applicant realized that successful methods and process flows for large-scale packaging not only have to resolve key technical challenges, but also should increase the degree of freedom for rerouting. Among the challenges are achieving reliable adhesion of metallic and plastic parts, achieving planarity of carriers and avoiding warpage and mechanical instability, achieving low resistance connections for rerouting, enabling a low resistance interconnect path from the same plane as the active side of silicon to the same plane as the backside of silicon, and improved thermal characteristics.

Applicant solved the challenges when he discovered process flows for packaged semiconductor devices which use adhesive tapes instead of epoxy chip attach procedures; and a sputtering methodology for replacing electroless plating; furthermore, the new process technology uses prefabricated parts such as metallic frames and is free of the need to use lasers. As a result, the new process flows preserve clean chip contact pads and offer the opportunity for low resistance interconnection from the active silicon surface to the opposite silicon surface.

In addition, the packaged devices offer improved reliability. A contributor to the enhanced reliability is reduced thermo-mechanical stress achieved by laminating gaps with insulating fillers having high modulus and a glass transition temperature for a coefficient of thermal expansion approaching the coefficient of silicon. Another contributor is a modified a sputtering technology with plasma-cleaned and cooled carriers, which produces uniform sputtered metal layers across the workpiece and thus avoids the need for electroless plating. Since the plasma-cleaning and sputtering procedure also serves to clean and roughen the substrate surface, the sputtered layers adhere equally well to dielectrics, silicon, and metals.

One embodiment based on the modified processes may be applied to a plurality of discrete chips placed on an adhesive carrier surface within a metallic frame of a size slightly larger than a chip; it is a technical advantage that another embodiment lends itself to a cluster of semiconductor chips. It is another technical advantage that for some devices the frame can be integrated as a means to bring backside chip contacts to the frontside with the chip terminals. It is another technical advantage that some of the packaged devices offer flexibility with regard to the connection to external parts: they can be finished to be suitable as devices with land grid arrays, or as ball grid arrays, or as and QFN (Quad Flat No-Lead) terminals.

BRIEF DESCRIPTION OF THE DRAWINGS

FIG. 5 is a cross section of a portion of the assembly illustrating the process of sputtering a metal layer over the exposed assembly surface of FIG. 4B.

FIG. 6 is a cross section of the assembly of FIG. 5 after depositing another metal layer and patterning both metal layers to create extended contact pads and rerouting traces.

FIG. 7 is a top of the assembly marking the cut lines of device singulation.

FIG. 8 illustrates a cross section of a singulated packaged device.

DETAILED DESCRIPTION OF THE PREFERRED EMBODIMENTS

Figure 1A:
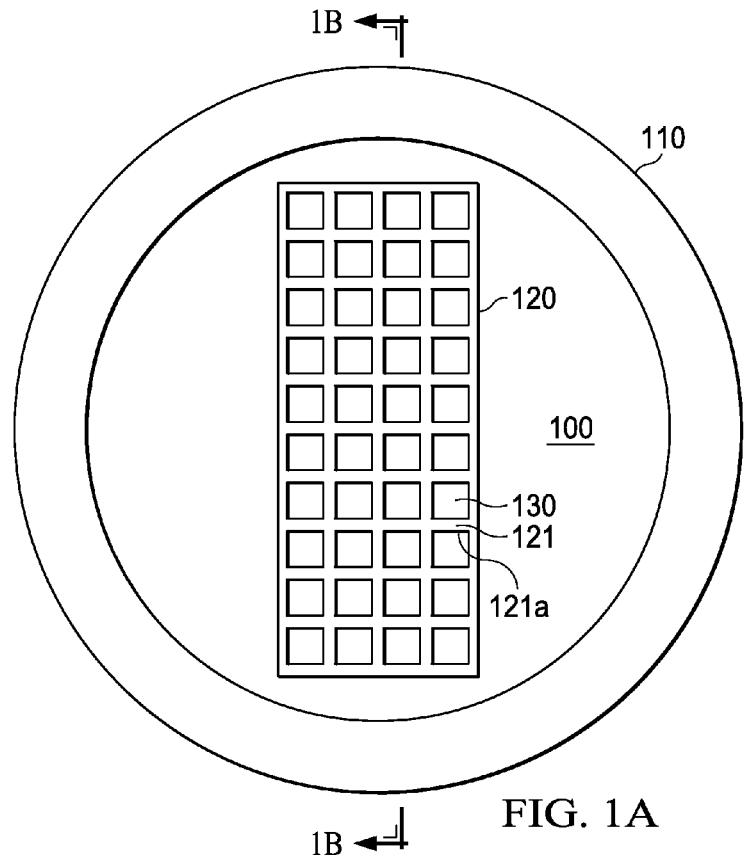
FIG. 1A shows a top view of a carrier tape secured in a frame with a metallic window frame attached to the adhesive tape surface.

An embodiment of the invention is a method for fabricating packaged semiconductor devices with embedded chips. Certain steps of the method are illustrated in FIGS. 1A through 7. At the start of the process flow, illustrated in FIG. 1A, a carrier 100 is provided. Carrier 100 is secured in a frame 110 in order to restrain warpage and be used as a possible interconnect from the front side to the back side. In the example of FIG. 1A, frame 110 has circular outline. In other examples, it may have rectangular outlines. As an example, carrier 100 may be a sheet with a core of an insulating clear laminate material with suitable load capacity. Carrier 100 has a surface covered by a layer 101 of an adhesive with an adhesive, which preferably is UV sensitive so that it can be released by UV irradiation. Frame 110 has lateral dimensions (such as the diameter of a circular frame) comparable to a semiconductor wafer.

In the process step included in FIG. 1A, a metallic window frame 120 is laid flat on carrier 100 and attached to the adhesive surface of carrier 100. Frame 120 includes a plurality of rectangular windows 130. The windows are bordered by the rims 121 of a metal grid and have a size larger than those semiconductor chips, which are intended to be placed inside the windows. In some devices, the windows are sized large enough to allow the placement of additional other parts, especially metallic parts, within the window for later integration into the device. The rims may be referred to as fiducials; the sidewalls 121a of the rims 121 face the windows 130. As an example, frame 120 may be made of copper or a copper alloy in a thickness between about 200 and 300 μm. It may be advantageous for some applications to provide a solderable metallurgy for the grid surface, which is attached to the tacky surface of carrier 100.

Figure 1B:
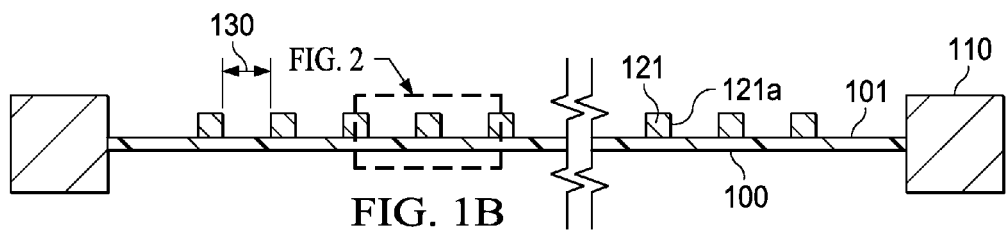
FIG. 1B depicts a cross section of the tape and the metal grid of the window frame.

FIG. 1B shows a cross section of carrier 100 secured in frame 110 and the grid of rims 121 along the elongated side of the window frame. The dashed outline refers to the enlargement of the grid portion in FIG. 2.

Figure 2:
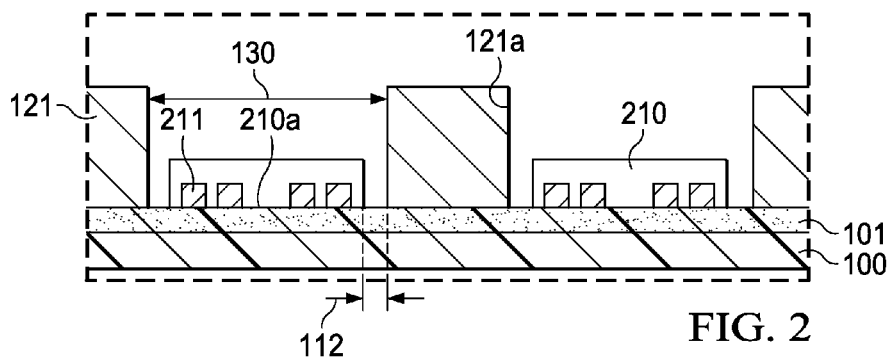
FIG. 2 illustrates a cross section of a portion of the tape and the frame after a plurality of semiconductor chips have been attached to the tape in the grid windows with the chip terminals facing the tape.

FIG. 2 illustrates the next process step. A plurality of semiconductor chips 210 is attached to the tacky layer 101 on the surface of carrier 100 within the respective openings 130 between adjacent fiducials 121. Chips 210 are spaced from fiducials sidewalls 121a by gaps 112. The chips have a surface 210a with terminals 211 facing the adhesive layer 101; for many chip types, their terminals have metal bumps.

Figure 3A:
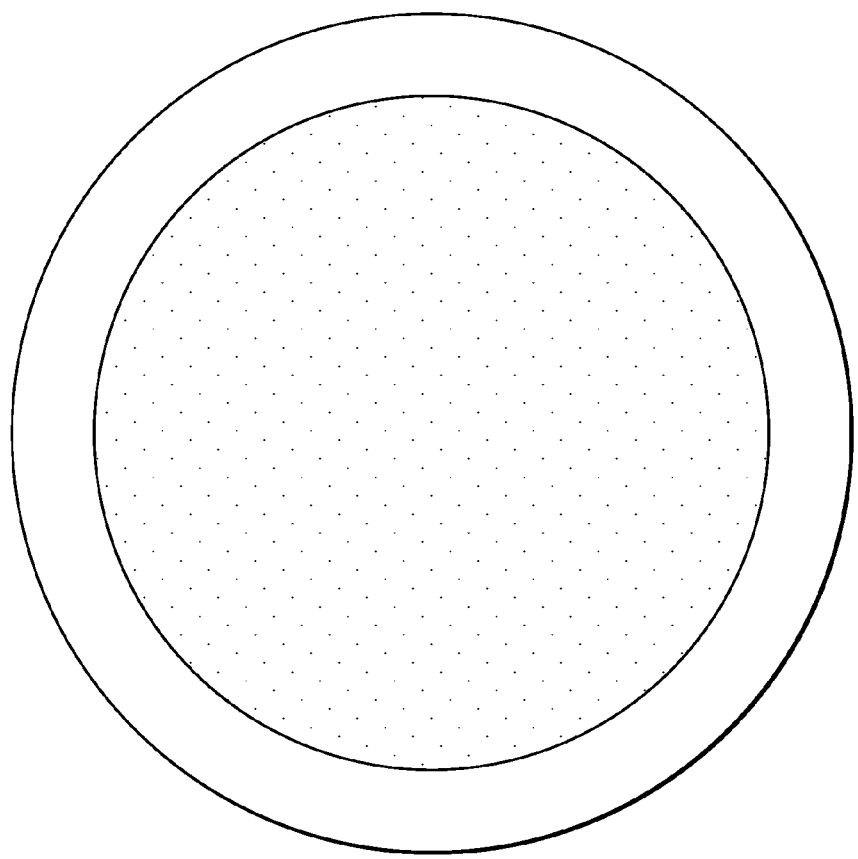
FIG. 3A shows a top view of the assembly after laminating it with an insulating material.
Figure 3B:
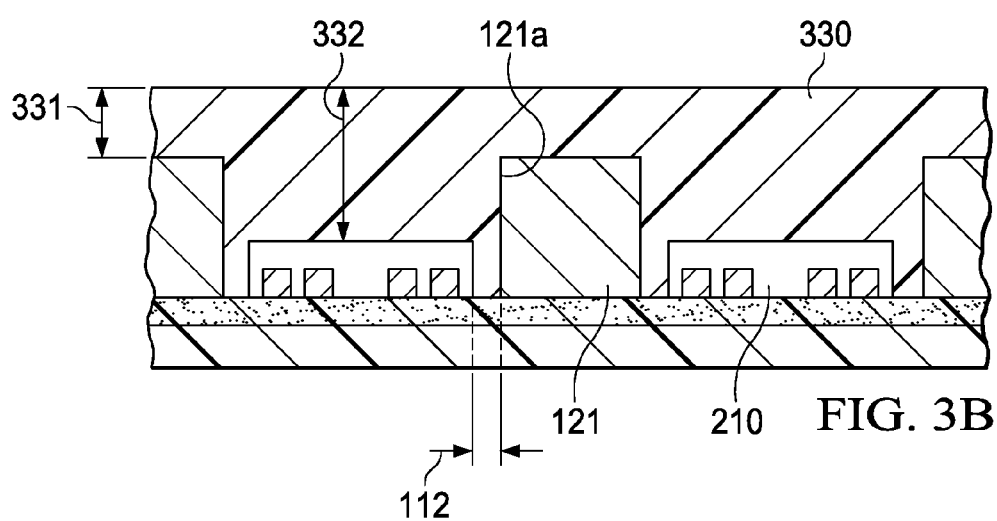
FIG. 3B depicts a cross section of a portion of the assembly after laminating the assembly with an insulating material.

FIGS. 3A and 3B depict the next process step of encapsulation. The assembly of FIG. 2 is brought into a production equipment such as a mold, in which, under compression, a compliant insulating material 330 is laminated in order to cohesively fill the gaps 112 between chips 210 and fiducials sidewalls 121a. Material 330 further covers the back sides of chips 210 and fiducials (rims) 121, and reaches a height 331 and 332 over the back sides of fiducials and chips, respectively. It should be pointed out that material 330 does not adhere to frame 110 (so that frame can later be removed; see below). For this reason, the top view of the encapsulation in FIG. 3A shows uniformly the insulating material. The compliant material is selected so that it exhibits a high modulus and low coefficient of thermal expansion (CTE) approaching the CTE of the semiconductor chips. Dependent on the selection of the insulating material, it may be advantageous to add a polymerization procedure in order to harden and enhance the rigidity of the assembly.

It is an option to use as the next process step a leveling or grinding technique to remove lamination material 330, until the backside of the fiducials 121, or the backside of the chips 210, is reached. The thus exposed backside of the metallic fiducials can represent a routing possibility for an independent electrical potential. Alternatively, the grinding process will be performed as a step before the dicing step (see below).

Figure 4A:
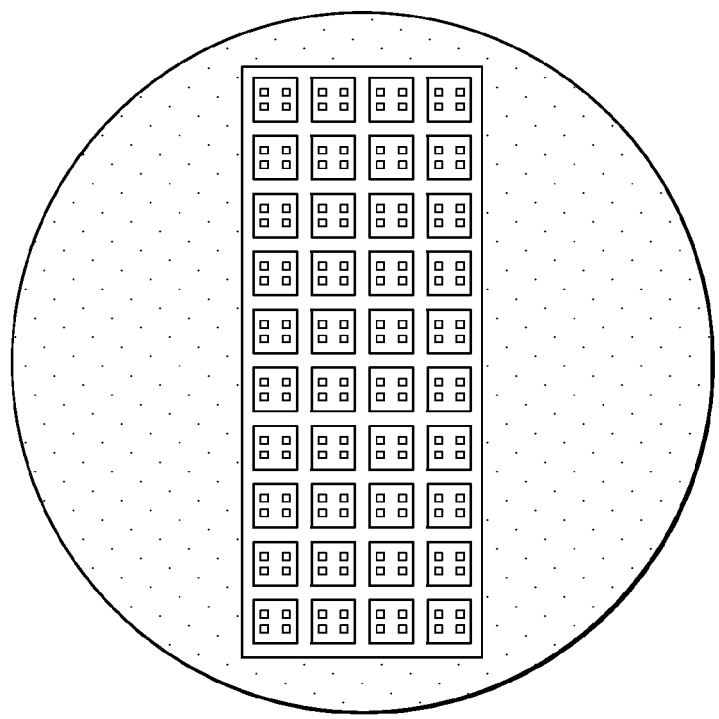
FIG. 4A depicts a top view of the assembly after inverting the assembly and removing the carrier tape, exposing the terminals of the chips.
Figure 4B:
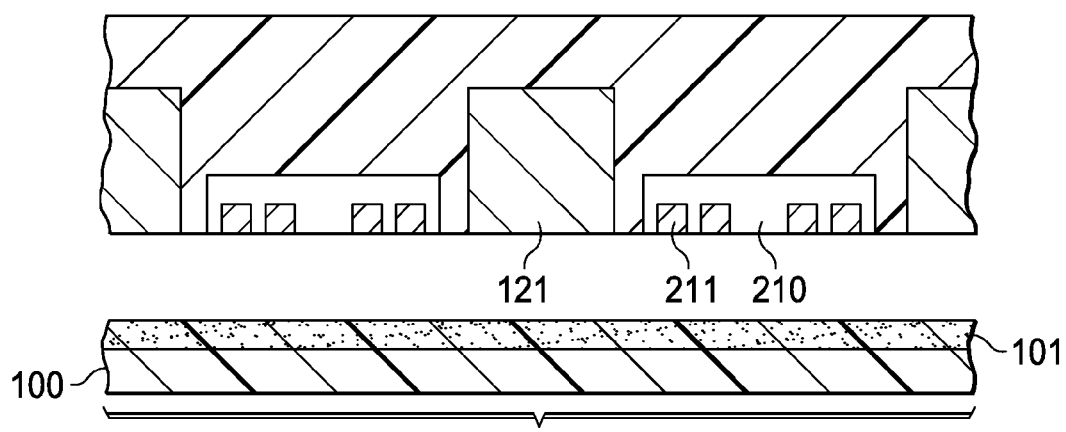
FIG. 4B is a top view of the assembly showing the process of removing the carrier tape and exposing the terminals of the chips embedded in the lamination material.

For the next process step, depicted in FIGS. 4A and 4B, the assembly of FIG. 3B is exposed to UV irradiation. As shown in FIG. 4B, carrier sheet 100 together with its adhesive layer 101 and frame 110 can thus be separated from the assembly. The assembly embedded in the polymerized material 330 may be considered a reconstituted wafer. Inverting the assembly (illustrated schematically in FIG. 4A) shows the exposed surfaces of the chips 210 with the terminals 211 and of the fiducials 121.

In FIG. 5, the reconstituted wafer with the packaged window frame including the metal grid and the assembled chips is transferred to the vacuum and plasma chamber of a sputtering equipment. The exposed surfaces of chip 210, terminals 211, fiducials 121, and lamination 330 are plasma-cleaned. The plasma accomplishes, besides cleaning the surface from adsorbed films, especially water monolayers, some roughening of the surfaces; both effects enhance the adhesion of the sputtered metal layer. While the panel is being cooled, at least one layer 540 of metal is sputtered, at uniform energy and rate, onto the exposed chips, fiducial, and lamination surfaces. The sputtered layer adheres to the multiple surfaces by energized atoms that penetrate the top surface of the panel, creating a non-homogeneous layer between the surface material and sputtered layers.

Preferably, the step of sputtering includes the sputtering of a first layer of a metal selected from a group including titanium, tungsten, tantalum, zirconium, chromium, molybdenum, and alloys thereof, wherein the first layer is adhering to chip, metal, and lamination surfaces; and without delay sputtering at least one second layer of a metal selected from a group including copper, silver, gold, and alloys thereof, onto the first layer, wherein the second layer is adhering to the first layer. The sputtered layers have the uniformity, strong adhesion, and low resistivity needed to serve, after patterning, as conductive traces for rerouting; the sputtered layers may also serve as seed metal for plated thicker metal layers.

In an alternative process flow, the deposition of the sputtered layers may be performed on the back side of the reconstituted wafer, where the grinding process mentioned above has exposed the back side of the chips and the metallic window frame and its rims. In this configuration, the sputtered metal layers function to connect the back side of the chips to the metal rims of the window frame and thus to establish a low resistance interconnect path from the plane of the chip back side to the plane of the active chip front side.

In the optional process step illustrated in FIG. 6, at least one layer 541 of metal is electroplated onto the sputtered layers 540. A preferred metal is copper. The plated layer is preferably thicker than the sputtered metal to lower the sheet resistance and thus the resistivity of the rerouting traces after patterning the plated and sputtered metal layers. Next are the processes of patterning the sputtered and plated metal layers in order to create connecting traces between chip terminal pads 211 and fiducials 121 serving as enlarged contact pads, which are positioned over the laminated material 330.

For some applications, it is preferred to deposit and pattern rigid insulating material, such as so-called solder resist, to protect and strengthen remaining chip areas not used for extended contacts and between the rerouting traces. An example is designated 870 in FIG. 8. Solder resist may be deposited by screen printing. Furthermore, it is preferred to perform a backgrinding step of the laminated material until the backside of the chips is reached.

In the next process step, indicated in FIG. 7, the window frame 120 is singulated into discrete devices; the preferred separating technique is sawing. The cuts may be made through metal rims 121 along lines indicated in FIG. 7. The cutaway view of a discrete device, shown in FIG. 8, illustrates a singulated device sawed by the above cutting option so that some of the enlarged contact pads 840 are positioned at the corners of the discrete device. Devices like the one shown and related devices can be utilized as land grid array devices, ball grid devices, and QFN (Quad Flat No-Lead) type devices.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

I claim:

1. A semiconductor device comprising:
    a semiconductor chip having a first chip surface with metallized terminals, and a parallel second surface;
    a frame of insulating material adhering to the sidewalls of the semiconductor chip, the frame having a first surface planar with the first chip surface and a parallel second surface planar with the second chip surface, the first frame surface including one or more embedded metallic fiducials extending from the first frame surface into the insulating material; and
    at least one film of sputtered metal extending from the terminals across the surface of a polymeric layer to the fiducials, the film patterned to form extended contact pads over the frame and rerouting traces between the chip terminals and the extended contact pads, the film adhering to the surfaces;
    wherein the metallic fiducials extend from the first frame surface to the parallel second frame surface planar with the second chip surface, conductively connecting the first and the second surface.

2. The device of claim 1 wherein the sputtered film includes a first layer of a metal selected from a group including titanium, tungsten, tantalum, zirconium, chromium, molybdenum, and alloys thereof, the first layer adhering to the chip terminals, polymeric surface, and frame surface; and at least one second layer of a metal selected from a group including copper, silver, gold, and alloys thereof, onto the first layer, the second layer adhering to the first layer.

3. The device of claim 2 further including at least one layer of plated metal adhering to the sputtered metals.

4. The device of claim 3 further including a patterned rigid material protecting exposed portions of the layer of insulating material and rerouting traces.

5. The device of claim 1 wherein the insulating material of the frame includes glass fibers impregnated with a gluey resin having a high modulus and a coefficient of thermal expansion (CTE) close to the CTE of silicon.

6. The device of claim 1 wherein the configuration and metallurgy of the extended contact pads are selected to be suitable to devices including land grid array devices, ball grid array devices, and Quad Flat No-Lead (QFN) devices.

* * * * *